(12) United States Patent
Chen et al.

(10) Patent No.: US 11,069,670 B2
(45) Date of Patent: Jul. 20, 2021

(54) CAMERA ASSEMBLY AND PACKAGING METHOD THEREOF, LENS MODULE, AND ELECTRONIC DEVICE

(71) Applicant: Ningbo Semiconductor International Corporation, Ningbo (CN)

(72) Inventors: Da Chen, Ningbo (CN); Mengbin Liu, Ningbo (CN)

(73) Assignee: Ningbo Semiconductor International Corporation, Ningbo (CN)

( * ) Notice: Subject to any disclaimer, the term of this patent is extended or adjusted under 35 U.S.C. 154(b) by 0 days.

(21) Appl. No.: 16/235,267

(22) Filed: Dec. 28, 2018

(65) Prior Publication Data

US 2020/0161289 A1     May 21, 2020

Related U.S. Application Data

(63) Continuation of application No. PCT/CN2018/119986, filed on Dec. 10, 2018.

(30) Foreign Application Priority Data

Nov. 20, 2018   (CN) .......................... 201811385606.6

(51) Int. Cl.
*H01L 25/18*       (2006.01)
*H01L 23/00*       (2006.01)
(Continued)

(52) U.S. Cl.
CPC .............. *H01L 25/18* (2013.01); *H01L 24/24* (2013.01); *H01L 24/82* (2013.01); *H01L 25/167* (2013.01);
(Continued)

(58) Field of Classification Search
None
See application file for complete search history.

(56) References Cited

U.S. PATENT DOCUMENTS

2006/0284215 A1* 12/2006 Maeda .............. H01L 27/14632
257/215
2008/0308928 A1* 12/2008 Chang ..................... H01L 24/24
257/723
(Continued)

FOREIGN PATENT DOCUMENTS

CN       103456754 A     12/2013
CN       103700634 A      4/2014
(Continued)

*Primary Examiner* — Quan Pham
(74) *Attorney, Agent, or Firm* — Anova Law Group, PLLC (57) ABSTRACT

The present disclosure provides a method for packaging a camera assembly. The method includes: providing a photosensitive chip; mounting an optical filter on the photosensitive chip; temporarily bonding the photosensitive chip and functional components on a carrier substrate, where the photosensitive chip has soldering pads facing away from the carrier substrate and the functional components have soldering pads facing toward the carrier substrate; forming an encapsulation layer covering the carrier substrate, the photosensitive chip, and the functional components, and exposing the optical filter; after the encapsulation layer is formed, removing the carrier substrate; and after the carrier substrate is removed, forming a redistribution layer structure on a side of the encapsulation layer facing away from the optical filter to electrically connect the soldering pads of the photosensitive chip with the soldering pads of the functional components.

11 Claims, 5 Drawing Sheets

(51) Int. Cl.
*H04N 5/225* (2006.01)
*H01L 25/16* (2006.01)
*H01L 25/00* (2006.01)
*H01L 27/146* (2006.01)

(52) U.S. Cl.
CPC ........... *H01L 25/50* (2013.01); *H04N 5/2253* (2013.01); *H04N 5/2254* (2013.01); *H01L 27/14618* (2013.01); *H01L 27/14636* (2013.01); *H01L 2224/24101* (2013.01); *H01L 2224/24137* (2013.01); *H01L 2224/24195* (2013.01); *H01L 2224/82005* (2013.01); *H01L 2224/82101* (2013.01)

(56) References Cited

U.S. PATENT DOCUMENTS

2010/0052192 A1* 3/2010 Hasegawa ......... H01L 27/14685
  257/797
2012/0038813 A1   2/2012 Jung et al.
2012/0273908 A1* 11/2012 Kinsman ........... H01L 27/14634
  257/432

FOREIGN PATENT DOCUMENTS

| CN | 203895459 U | 10/2014 |
| CN | 105244359 A | 1/2016 |
| CN | 106206485 A | 12/2016 |
| CN | 107958881 A | 4/2018 |
| JP | 2007123351 A * | 5/2007 |

* cited by examiner

CAMERA ASSEMBLY AND PACKAGING METHOD THEREOF, LENS MODULE, AND ELECTRONIC DEVICE

CROSS-REFERENCES TO RELATED APPLICATIONS

This application is a continuation application of PCT patent application No. PCT/CN2018/119986, filed on Dec. 10, 2018, which claims the priority of Chinese patent application Nos. CN201811385606.6, filed on Nov. 20, 2018, the entire contents of all of which are incorporated herein by reference.

FIELD OF THE DISCLOSURE

The present disclosure generally relates to the field of lens module technology and, more particularly, relates to a camera assembly, a packaging method thereof, a lens module, and an electronic device.

BACKGROUND

As people's living standards continuously improve, people have more free time to enjoy their leisure life. Photo-capturing has gradually become a common means for people to record their outings and various aspects of their daily life. Thus, electronic devices (e.g., mobile phones, tablets and cameras) with camera functions are widely used in people's daily life and work and gradually become indispensable tools nowadays.

Electronic devices with camera functions are often configured with a lens module. The design level of the lens modules plays an important role for determining quality of photographs taken by the electronic device. The lens module often includes a camera assembly having a photosensitive chip and a lens assembly mounted on the camera assembly, used to capture images of photographed objects.

Moreover, to improve the imaging capability of the lens module, the photosensitive chip may be required to have a large imaging area accordingly. Further, the lens module often includes passive components such as resistors and capacitors, and peripheral circuit chips.

BRIEF SUMMARY OF THE DISCLOSURE

One aspect of the present disclosure provides a method for packaging a camera assembly. The method includes: providing a photosensitive chip; mounting an optical filter on the photosensitive chip; temporarily bonding the photosensitive chip and functional components on a carrier substrate, where the photosensitive chip has soldering pads facing away from the carrier substrate and the functional components have soldering pads facing toward the carrier substrate; forming an encapsulation layer covering the carrier substrate, the photosensitive chip, and the functional components, and exposing the optical filter; after the encapsulation layer is formed, removing the carrier substrate; and after the carrier substrate is removed, forming a redistribution layer structure on a side of the encapsulation layer facing away from the optical filter to electrically connect the soldering pads of the photosensitive chip with the soldering pads of the functional components.

Another aspect of the present disclosure provides a camera assembly. The camera assembly includes: a photosensitive unit, including a photosensitive chip and an optical filter mounted on the photosensitive chip; functional components; an encapsulation layer, embedded with the photosensitive unit and the functional components, where the photosensitive chip and the functional components are exposed from a bottom surface of the encapsulation layer, a top surface of the encapsulation layer is higher than the photosensitive chip and functional components and exposes the optical filter, the photosensitive chip has soldering pads facing away from the bottom surface of the encapsulation layer, and the functional components have soldering pads exposed from the bottom surface of the encapsulation layer; and a redistribution layer structure, disposed on the bottom surface of the encapsulation layer and electrically connecting to the soldering pads.

Another aspect of the present disclosure provides a lens module. The lens module includes: a camera assembly, which includes: a photosensitive unit, including a photosensitive chip and an optical filter mounted on the photosensitive chip; functional components; an encapsulation layer, embedded with the photosensitive unit and the functional components, where the photosensitive chip and the functional components are exposed from a bottom surface of the encapsulation layer, a top surface of the encapsulation layer is higher than the photosensitive chip and functional components and exposes the optical filter, the photosensitive chip has soldering pads facing away from the bottom surface of the encapsulation layer, and the functional components have soldering pads exposed from the bottom surface of the encapsulation layer; and a redistribution layer structure, disposed on the bottom surface of the encapsulation layer and electrically connecting to the soldering pads; and a lens assembly, electrically connecting to the photosensitive chip and the functional components and including a frame mounted on the top surface of the encapsulation layer and surrounding the photosensitive unit and the functional components.

Another aspect of the present disclosure provides an electronic device. The electronic device includes the disclosed lens module.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

In the following description, numerous specific details are set forth to provide a more thorough understanding of the disclosure. However, it will be apparent to those skilled in the art that the present disclosure may be implemented without one or more of these details. In other instances, some of the technical features well known in the art are described herein to avoid confusion with the present disclosure.

It should be understood that the disclosed methods and structures can be implemented in various forms and should not be construed as limited to the embodiments set forth in the present disclosure. Instead, these embodiments are provided so that the present disclosure will be thorough and complete. In the accompanying drawings, the size and relative dimensions of the layers and regions may be enlarged for clarity. The same reference numbers indicate the same elements throughout the present disclosure.

It should be understood that when an element or layer is referred to as "on", "adjacent to", "connected to" or "coupled to" another element or layer, it may be directly placed on the other element or layer, or may be adjacent to, connected to, or coupled to the other element or layer. Alternatively, the element or layer may be indirectly placed on the other element or layer, or may be adjacent to, connected to, or coupled to the other element or layer as some intermediate elements and/or layers are disposed between. In contrast, when an element is referred to as "directly on", "directly adjacent to", "directly connected to", or "directly coupled to" another element or layer, no intermediate element or layer is disposed between.

It should be understood that although the terms such as first, second, third, etc. are used to describe various components, regions, layers, and/or portions, these components, regions, layers, and/or portions should not be limited by the terms of first, second, third, etc. These terms are merely used to distinguish an element, component, region, layer, or portion. Therefore, a first element, component, region, layer, or portion discussed in the present disclosure may be alternatively represented as a second element, component, region, layer, or portion.

Spatial relationship terms such as "under", "below", "the lower", "underneath", "above", "the upper", etc. are used here for illustrative purposes. The terms may be used to describe the relationship of one element or feature shown in a figure with respect to other elements or features. It should be understood that in addition to the orientation shown in the figures, the spatially relative terms are intended to encompass different orientations of the device in use and operation. For example, when a device in the figures is flipped, an element or feature described as "under another element", "under", or "below" may be oriented "above" the other element or feature. Thus, the exemplary terms "below" and "under" may include both up and down directions. A device may be otherwise oriented (e.g. rotated 90 degrees or oriented to other orientation), and the spatial descriptive terms used herein may be interpreted accordingly.

The terms used herein are merely for the purpose of describing the particular embodiments and are not intended to limit the scope of the present disclosure. When using the singular forms such as "a", "one", and "the/this", these terms are also intended to include the plural forms, unless otherwise specified in the context. It should also be understood that when the terms "composed of" and/or "comprising" are used in the specification, they are intended to describe the presence of features, integers, steps, operations, elements, and/or components, but not to exclude the presence or addition of one or more other features, integers, steps, operations, elements, components, and/or groups. When used in the present disclosure, the term "and/or" includes any and all combinations of the listed related items.

Various embodiments of the present disclosure are described herein with reference to schematic illustrations of cross-sectional views of the structures (and intermediate structures) according to the preferred embodiments of the present disclosure. Thus, deviations from the illustrated shapes may be expected due to, e.g. manufacturing techniques and/or tolerances. Therefore, the embodiments of the present disclosure should not be limited to the specific shapes of the regions illustrated herein, but should include variations in the shapes due to, e.g. manufacturing. For example, an implanted region shown as a rectangle has rounded or curved features and/or an implantation gradient at the edges, rather than has a binary change from the implanted region to the non-implanted region. Similarly, a buried region formed by implantation can result in some implantation in the region between the buried region and the surface through which the implantation is performed. Therefore, the regions shown in the figures are illustrative and the shapes of the regions are not intended to represent the actual shapes of the regions of the device, and thus, the shapes of the regions are not intended to limit the scope of the present disclosure.

Currently, operational performance of lens module needs to be improved and it is difficult to miniaturize and reduce thickness of the lens module.

An existing lens module primarily includes circuit boards, a photosensitive chip, functional components (e.g., peripheral chips), and a lens assembly. The peripheral chips are often surface-mounted on a peripheral main board. The photosensitive chip is separated from the functional components. The circuit boards provide mechanical support for the photosensitive chip, the functional components, and the lens assembly and electrical connections between the photosensitive chip, the functional components, and the lens assembly.

However, to satisfy the requirements for high pixel density and ultra-thin thickness of the lens module, the lens module needs to provide higher and higher imaging quality. Accordingly, photo-sensing area of the photosensitive chip increases, and the number of the functional components increases. Thus, the dimension of the lens module grows too big to satisfy the requirements for miniaturization and ultra-thin thickness of the lens module. Further, the photosensitive chip is disposed inside a support frame of the lens module while the peripheral chips are disposed outside the support frame of the lens module. Thus, the photosensitive chip and the peripheral chips are separated by a certain distance, thereby reducing signal transmission speed. The peripheral chips include a digital signal processor (DSP) chip and a memory chip. It is likely that shooting speed and storing speed may be negatively impacted, thereby degrading the operational performance of the lens module.

The present disclosure provides a camera assembly, a method for packaging the camera assembly, a lens module, and an electronic device, for improving the operational performance of the lens module and reducing a total thickness of the lens module.

According to embodiments of the present disclosure, a photosensitive chip and functional components are integrated into an encapsulation layer and are electrically connected with each other through a redistribution layer (RDL) structure. As a result, the physical distances between the photosensitive chip and the functional components decrease, the electrical connections between the photosensitive chip and the functional components are shortened, the signal transmission speed increases, and the operational performance of the lens module improves. Further, the combination of an encapsulation layer and a redistribution layer structure helps eliminate the circuit boards and reduces a total thickness of the lens module, thereby satisfying the requirements for miniaturization and the ultra-thin thickness of the lens module.

In order to make the present disclosure easy to understand, detailed steps and corresponding structures will be provided to explain the technical solutions of the present disclosure. In the following, various preferred embodiments of the present disclosure are described in detail. However, it should be noted that in addition to the embodiments described herein, the present disclosure may be implemented in other forms.

Figure 15:
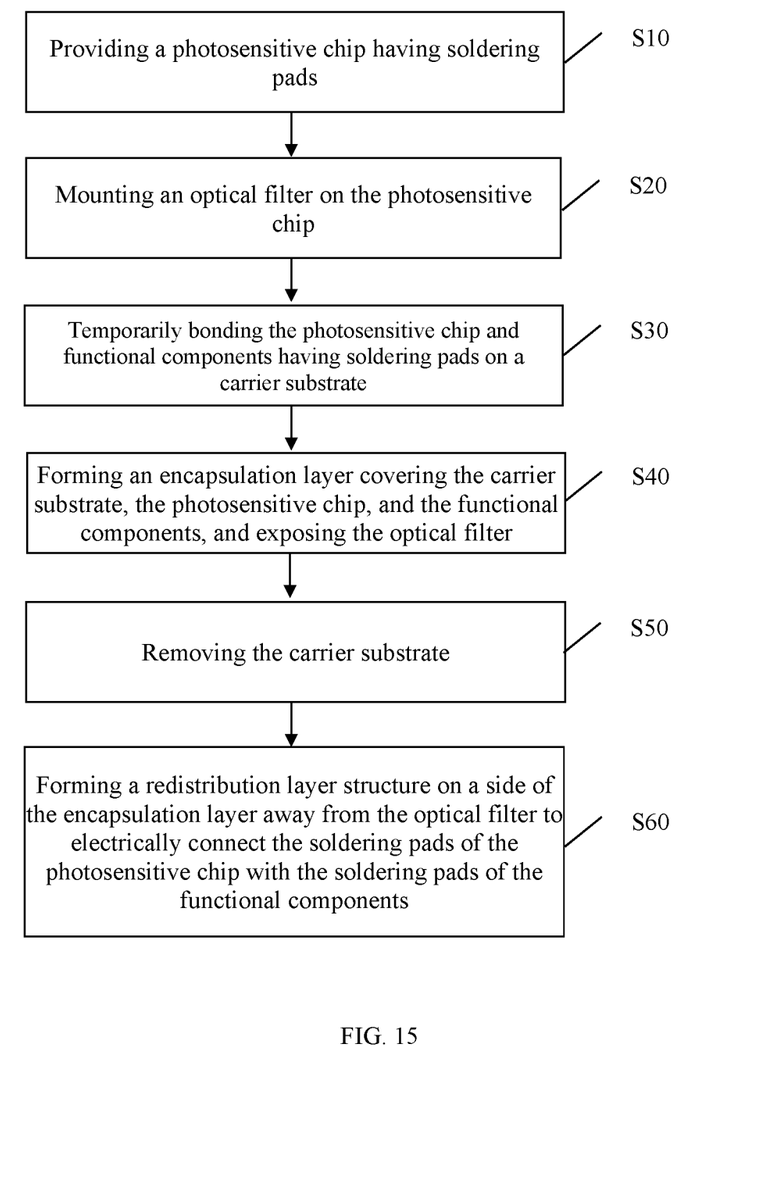
FIG. 15 illustrates a flowchart of an exemplary method for packaging an exemplary camera assembly according to an embodiment of the present disclosure.

FIG. 15 illustrates a flowchart of an exemplary method for packaging an exemplary camera assembly according to an embodiment of the present disclosure. FIGS. 1-12 illustrate schematic cross-sectional views of structures at certain stages of an exemplary method for packaging an exemplary camera assembly according to an embodiment of the present disclosure.

Figure 1:
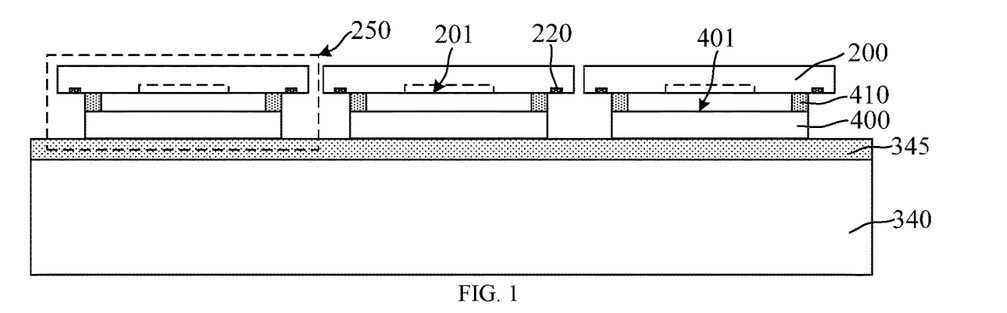
FIGS. 1-12 illustrate schematic cross-sectional views of structures at certain stages of an exemplary method for packaging an exemplary camera assembly according to an embodiment of the present disclosure.
Figure 2:
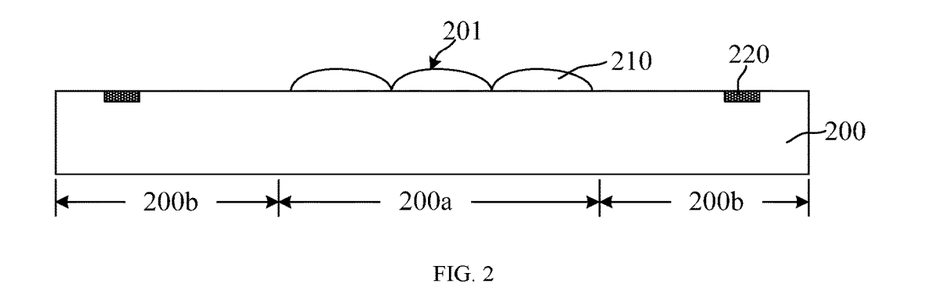

Referring to FIG. 1 and FIG. 2, FIG. 2 illustrates an enlarged view of a photosensitive chip in FIG. 1. As shown in FIG. 2, the photosensitive chip 200 is provided (e.g., as shown in S10 of FIG. 15). The photosensitive chip 200 has soldering pads.

The photosensitive chip 200 may be an image sensor chip. In one embodiment, the photosensitive chip 200 may be a CMOS image sensor (CIS) chip. In other embodiments, the photosensitive chip 200 may be a CCD (charge coupled device) image sensor chip.

In one embodiment, the photosensitive chip 200 may have optical signal receiving surfaces 201. The photosensitive chip 200 may receive and sense optical irradiation signals through the optical signal receiving surfaces 201. For example, the photosensitive chip 200 may include a photosensitive region 200a (as shown in FIG. 2) and a peripheral region 200b (as shown in FIG. 2) surrounding the photosensitive region 200a. The optical signal receiving surfaces 201 may be disposed in the photosensitive region 200a.

The photosensitive chip 200 may include a plurality of pixel units. Thus, the photosensitive chip 200 may include a plurality of semiconductor photosensitive devices (not shown) and a plurality of filtering filter films (not shown) disposed on the plurality of semiconductor photosensitive devices. The plurality of filtering films may be configured to selectively absorb and pass optical signals received from the optical signal receiving surfaces 201. The photosensitive chip 200 may also include a plurality of micro-lenses 210 disposed on the plurality of filtering films. Each of the plurality of micro-lenses 210 may one-to-one correspond to each of the plurality of semiconductor photosensitive devices. Thus, rays of the received optical irradiated signals may be focused on the plurality of semiconductor photosensitive devices, respectively. The optical signal receiving surfaces 201 may correspond to top surfaces of the plurality of micro-lenses 210.

It should be noted that the photosensitive chip 200 may be a silicon-based chip and may be fabricated by an integrated circuit fabrication technology. The photosensitive chip 200 may have soldering pads configured for electrically connecting the photosensitive chip 200 with other chips or components. In one embodiment, the photosensitive chip 200 may have first chip soldering pads 220 formed in the peripheral region 200b. The first chip soldering pads 220 may be exposed on a surface of the photosensitive chip 200 on the same side of the optical signal receiving surfaces 201.

Figure 3:
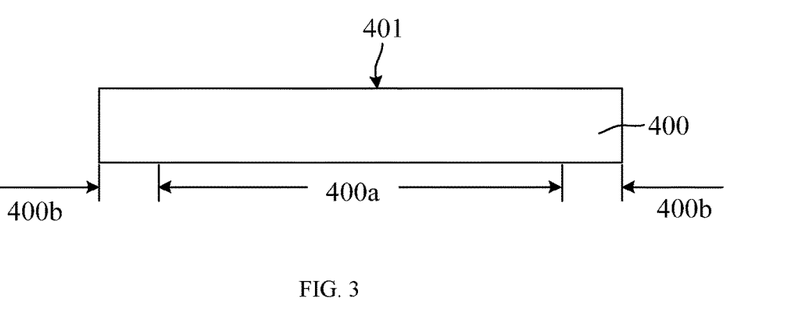

Referring to FIG. 1 and FIG. 2 in conjunction with FIG. 3, FIG. 3 illustrates an enlarged view of an optical filter 400 in FIG. 1. The optical filter 400 may be mounted on the photosensitive chip 200 (as shown in FIG. 1 and in S20 of FIG. 15).

After the optical filter 400 is mounted on the photosensitive chip 200, a photosensitive unit 250 may be formed. Mounting the optical filter 400 on the photosensitive chip 200 may prevent subsequent packaging process from polluting the optical signal receiving surfaces 201 and may reduce the total thickness of a subsequently formed lens module. Thus, the requirements for miniaturization and ultra-thin thickness of the lens module may be satisfied.

The optical filter 400 may be an infrared filtering glass plate or a fully transparent glass plate. In one embodiment, the optical filter 400 may be the infrared filtering glass plate to eliminate an effect of infrared light in the incident light on performance of the photosensitive chip 200, thereby improving imaging effectiveness.

For example, the optical filter 400 may be an infrared cut filter (IRCF). The infrared cut filter may be a blue glass infrared cut filter or a glass plate coated with an infrared cut coating. In one embodiment, the optical filter 400 may include a to-be-bonded surface 401. The to-be-bonded surface 401 may be configured to provide a surface for mounting on the photosensitive chip 200, that is, a surface facing toward the photosensitive chip 200.

For example, when the optical filter 400 is the blue glass infrared cut filter, a surface of the blue glass infrared cut filter may be coated with a transmittance enhancing film or an antireflection film, and another surface opposite to the transmittance enhancing film or the antireflection film may be the to-be-bonded surface 401. When the optical filter 400 is a glass plate coated with the infrared cut coating, another surface opposite to the infrared cut coating may be the to-be-bonded surface 401. In other embodiments, when the optical filter 400 is the fully transparent glass plate, any surface of the fully transparent glass plate may be the to-be-bonded surface 401.

As shown in FIG. 3, the optical filter 400 may include a light transmittance region 400a and a peripheral region 400b surrounding the light transmittance region 400a. The light transmittance region 400a may be configured to let external incident light pass through such that the optical signal receiving surfaces 201 of the photosensitive chip 200 may receive optical signals, thereby ensuring the normal operational function of the lens module. A space for mounting the optical filter 400 on the photosensitive chip 200 may be reserved in the peripheral region 400b.

As shown in FIG. 1, in one embodiment, the optical filter 400 may be mounted on the photosensitive chip 200 by a bonding structure 410. The bonding structure 410 may surround the optical signal receiving surfaces 201.

The bonding structure 410 may be configured to physically connect the optical filter 400 and the photosensitive chip 200 and to form a cavity (not labelled) enclosed by the optical filter 400, the bonding structure 410, and the photosensitive chip 200 to prevent the optical filter 400 from directly contacting the photosensitive chip 200, thereby avoiding the performance degradation of the photosensitive chip 200 caused by the optical filter 400.

In one embodiment, the bonding structure 410 may surround the optical signal receiving surfaces 201 to place the optical filter 400 disposed above the optical signal receiving surfaces 201 in a photo-sensing path of the photosensitive chip 200, thereby ensuring the optical performance of the photosensitive chip 200.

For example, the bonding structure 410 may be made of a lithographic material, and may be formed by a photolithography process, which not only improves topography quality and dimensional accuracy of the bonding structure 410, packaging efficiency, and production yield, but also reduces the degradation of bonding strength of the bonding structure 410.

In one embodiment, the bonding structure 410 may be made of a photolithographic dry film. In other embodiments, the bonding structure 410 may be made of a photolithographic polyimide, a photolithographic polybenzoxazole (PBO), or a photolithographic benzocyclobutene (BCB).

In one embodiment, to reduce complexity of the process of forming the bonding structure 410, simplify the process steps, and reduce the performance degradation of the optical signal receiving surfaces 201 caused by the fabrication process of the bonding structure 410, the bonding structure 410 may be formed on the optical filter 400.

For example, as shown in FIG. 1, the bonding step may include: providing a first carrier substrate 340; temporarily bonding a surface of the optical filter 400 facing away from the to-be-bonded surface 401 to the first carrier substrate 340; after the temporary bonding is completed, forming a circular bonding structure 410 in the peripheral region 400b (as shown in FIG. 3) of the optical filter 400; placing the optical signal receiving surfaces 201 of the photosensitive chip 200 in a position facing toward the circular bonding structure 410; and mounting the peripheral region 200b (as shown in FIG. 2) of the photosensitive chip 200 on the circular bonding structure 410 to form the photosensitive unit 250.

The first carrier substrate 340 may be configured to provide a platform for subsequent bonding process, thereby improving process operability. In one embodiment, the first carrier substrate 340 may be a carrier wafer. In other embodiments, the first carrier substrate 340 may be other types of substrate.

For example, the optical filter 400 may be temporarily bonded on the first carrier substrate 340 by a first temporary bonding layer 345. The first temporary bonding layer 345 may be configured to act as a peeling layer to facilitate subsequent debonding.

In one embodiment, the first temporary bonding layer 345 may be a foamed film. The foamed film may include a micro-adhesive surface and a foaming surface, facing opposite to each other. The foamed film may have a viscosity at a normal temperature. The foaming surface may be attached to the first carrier substrate 340. The foamed film may be subsequently heated such that the foaming surface may lose the viscosity and the foamed film may be detached. In other embodiments, the first temporary bonding layer 345 may also be a die attach film (DAF).

Figure 4:
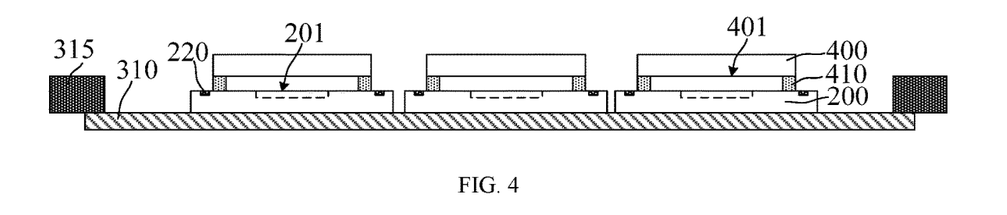

Referring to FIG. 4, it should be noted that, after the mounting step is completed, the packaging method may further include: attaching the optical signal receiving surfaces 201 of the photosensitive chip 200 to an ultra-violet (UV) film 310; and after the attaching step is completed, performing a first debonding process to remove the first carrier substrate 340 (as shown in FIG. 1).

Through the attaching step, the photosensitive unit 250 may be prepared for temporarily bonding on another carrier substrate in a subsequent step. The UV film 310 may be configured to provide support and fixation function for the photosensitive unit 250 after the first carrier substrate 340 is removed. After being irradiated by a UV light, the adhesion force of the UV film 310 may be weakened such that the photosensitive unit 250 may be easily removed from the UV film 310.

For example, a film applicator may be used to tightly attach the UV film 310 to a surface of the photosensitive chip 200 facing away from the optical signal receiving surfaces 201 and to the bottom of a frame 315 having a large diameter. The frame 315 may serve a function of stretching the UV film 310, such that the photosensitive units 250 may be separately fixed to the UV film 310. The detailed description of the UV film 310 and the frame 315 will not be repeated herein.

In one embodiment, the first temporary bonding layer 345 (as shown in FIG. 1) may be the foamed film. Thus, the first debonding process may be a thermal debonding process. For example, the first temporary bonding layer 345 may be subject to a heat treatment for the foaming surface of the foamed film to lose the viscosity. As such, the first carrier substrate 340 may be removed, and then, the first temporary bonding layer 345 may be removed by tearing off.

Figure 5:
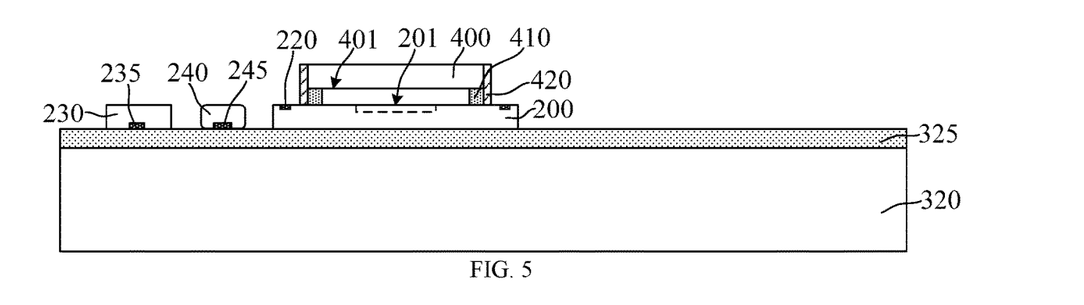

Referring to FIG. 5, a second carrier substrate 320 may be provided. The functional components (not labelled) and the photosensitive chip 200 may be temporarily bonded on the second carrier substrate 320 (e.g., as shown in S30 of FIG. 15). The functional components may have soldering pads (not labelled). The soldering pads of the photosensitive chip 200 may be disposed on a surface of the photosensitive chip 200 facing away from the second carrier substrate 320. The soldering pads of the functional components may be disposed on a surface of the functional components facing toward the second carrier substrate 320.

Temporarily bonding the functional components and the photosensitive chip 200 on the second carrier substrate 320 may prepare for subsequent packaging integration process and electrical connection integration process of the functional components and the photosensitive chip 200.

Further, the method of temporary bonding (TB) may make it convenient to subsequently separate the functional components and the photosensitive chip 200 from the second carrier substrate 320. The second carrier substrate 320 may provide a platform for subsequent process of forming the encapsulation layer.

In one embodiment, the second carrier substrate 320 may be a carrier wafer. In other embodiments, the second carrier substrate 320 may be other types of substrate.

For example, the functional components and the photosensitive chip 200 may be temporarily bonded on the second carrier substrate 320 by a second temporary bonding layer 325. In one embodiment, the second temporary bonding layer 325 may be a foamed foaming film. The description of the second temporary bonding layer 325 may refer to the relevant description of the first temporary bonding layer 345 (as shown in FIG. 1) and will not be repeated herein.

In one embodiment, after the photosensitive chip 200 is temporarily bonded on the second carrier substrate 320, the first soldering pads 220 of the photosensitive chip 200 may be disposed on a surface of the photosensitive chip 200 facing away from the second carrier substrate 320.

For example, an ultra-violet light may be irradiated on a position of the UV film 310 (as shown in FIG. 4) where a single photosensitive unit 250 (as shown in FIG. 1) is located. The UV film 310 at the position irradiated by the UV light may lose the viscosity. The corresponding photosensitive unit 250 may be pushed up by a thimble and then may be lifted by a suction device. The photosensitive units 250 may be peeled off from the UV film 310 one by one and may be placed on the second carrier substrate 320 sequentially. The process of placing the photosensitive units 250 one by one on the second carrier substrate 320 may help improve positional accuracy of the photosensitive units 250 on the second carrier substrate 320.

In one embodiment, only one photosensitive unit 250 may be illustrated. In other embodiments, when the formed lens module is applied to a dual camera or array module product, a plurality of photosensitive units 250 may be included.

It should be noted that, in one embodiment, after the optical filter 400 is mounted on the photosensitive chip 200, the photosensitive chip 20 may be temporarily bonded on the second carrier substrate 320. In other embodiments, the optical filter may be mounted on the photosensitive chip after the photosensitive chip is temporarily bonded on the second carrier substrate.

The functional components may be components with specific functions in the camera assembly other than the photosensitive chip 200. The functional components may include at least one of peripheral chips 230 or passive components 240. In one embodiment, the functional components may include the peripheral chips 230 and the passive components 240.

The peripheral chips 230 may be active components. After the peripheral chips 230 are electrically connected to the photosensitive chip 200 in a subsequent step, the peripheral chips 230 may be configured to provide peripheral circuits for the photosensitive chip 200. For example, the peripheral chips 230 may include an analog power supply circuit, a digital power supply circuit, a voltage buffer circuit, a shutter control circuit, a shutter driving circuit, etc.

In one embodiment, the peripheral chips 230 may include one or two of digital signal processing chip and memory chip. In other embodiments, the peripheral chips 230 may also include chips of other functional types. For illustrative purposes, FIG. 5 only shows one peripheral chip 230. However, the number of the peripheral chips 230 may be more than one.

The peripheral chips 230 may be silicon-based chips and may be fabricated by integrated circuit fabrication technologies. The peripheral chips 230 may have soldering pads for electrically connecting to other chips and components. In one embodiment, the peripheral chips 230 may have second chip soldering pads 235.

In one embodiment, to reduce complexity of subsequent electrical connection process, the peripheral chips 230 may be temporarily bonded on the second carrier substrate 320. The second chip soldering pads 235 of the peripheral chips 230 may be disposed on a surface of the peripheral chips 230 facing toward the second carrier substrate 320.

The passive components 240 may be configured to provide specific functions in the photo-sensing operation of the photosensitive chip 200. The passive components 240 may include resistors, capacitors, inductors, diodes, transistors, potentiometers, relays, drivers, and other small size electronic components. For illustrative purposes, FIG. 5 only shows one passive component 240. But the number of the passive components 240 may be more than one.

The passive components 240 may also have soldering pads for electrically connecting to other chips and components. In one embodiment, the soldering pads of the passive components 240 may be electrodes 245. To reduce complexity of subsequent electrical connection process, the passive components 240 may be temporarily bonded on the second carrier substrate 320. The electrodes 245 of the passive components 240 may be disposed on a surface of the passive components 240 facing toward the second carrier substrate 320.

It should be noted that making the soldering pads of the functional components face toward the second carrier substrate 320 may not only reduce complexity of subsequent process of forming the redistribution layer structure 360, but also avoid controlling thickness differences between the photosensitive chip 200 and the functional components. Thus, the packaging process may be simplified.

Figure 6:
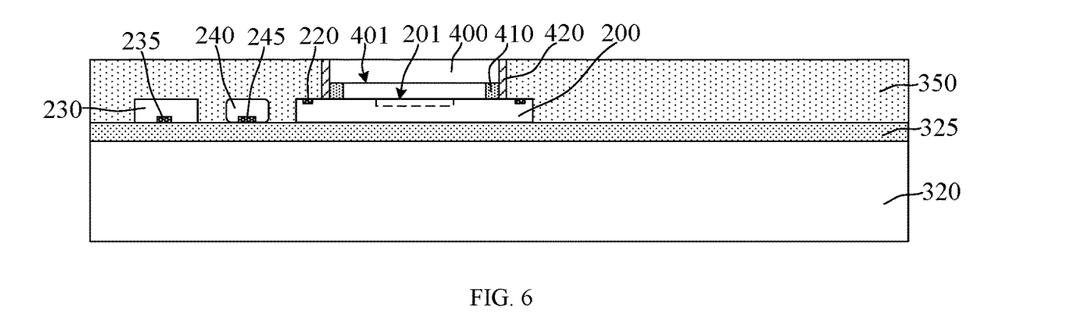

Referring to FIG. 6, the encapsulation layer 350 may be formed to cover the second carrier substrate 320, the photosensitive chip 200 and the functional components (not labeled) while exposing the optical filter 400 (e.g., as shown in S40 of FIG. 15).

The encapsulation layer 350 may play a role in holding the photosensitive chip 200 and the functional components (e.g., peripheral chips 230, passive components 240) in place and achieving packaging integration of the photosensitive chip 200 and the functional components.

The encapsulation layer 350 may not only help reduce a space occupied by the frame of the lens assembly, but also eliminate circuit boards (e.g., PCB). Thus, the total thickness of the subsequently formed lens module may be substantially reduced to satisfy the requirements for miniaturization and ultra-thin thickness of the lens module. Moreover, compared to the solution of mounting the functional components on the peripheral main board, integrating the photosensitive chip 200 and the functional components in the encapsulation layer 350 may reduce physical distances as well as electrical connection distances between the photosensitive chip 200 and the functional components. Thus, the signal transmission speed may be increased and the operational performance (e.g., improving shooting speed and storing speed) of the lens module may be improved.

The encapsulation layer may also play a role in insulation, sealing and moisture-proof, and may improve the reliability of the lens module. In one embodiment, the encapsulation layer 350 may be made of epoxy resin. Epoxy resin has the advantages of low shrinkage, good adhesion, corrosion resistant, superior electrical properties, and low cost. Epoxy resin is widely used in packaging electronic components and integrated circuits.

In one embodiment, the encapsulation layer 350 may be formed by using an injection molding process. The injection molding process has the advantages of fast production speed, high efficiency, and automation of operation. Using the injection molding may increase the output and reduce the process cost.

For example, the step of forming the encapsulation layer 350 may include: temporarily bonding the functional components (not labelled) and the photosensitive chip 200 on the second carrier substrate 320; after the optical filter 400 is mounted on the photosensitive chip 200, placing the second carrier substrate 320 in a mold having an upper part and a lower part; positioning the second carrier substrate 320 between the upper part and the lower part of the mold; after the upper part and the lower part are clamped together to close the mold, pressing the mold against the second carrier substrate 320 and the optical filter 400 and forming a cavity between the upper part and the lower part of the mold; injecting a molding material into the cavity to form the encapsulation layer 350; and removing the mold.

In other embodiments, an encapsulation layer may be formed by using other molding processes. For example, after the encapsulation layer is formed covering an optical filter, the encapsulation layer may be etched or grinded to remove any portion of the encapsulation layer higher than the optical filter, thereby exposing the top surface of the optical filter in the remaining encapsulation layer. The top surface of the optical filter may be a surface of the optical filter facing away from the photosensitive chip.

Because the encapsulation layer 350 covers the photosensitive chip 200 and the functional components, any negative impact on the process of forming the encapsulation layer 350 due to thickness differences between the photosensitive chip 200 and the functional components may be avoided. Accordingly, controlling the thickness differences between the photosensitive chip 200 and the functional components may be avoided, thereby simplifying the process.

In one embodiment, the encapsulation layer 350 may also cover a sidewall of the optical filter 400 to improve the sealing performance of the cavity in the photosensitive unit 250 and to prevent water vapor and oxidizing gas from entering the cavity, thereby ensuring the performance of the photosensitive chip 200. In addition, the optical filter 400 may be prevented from protruding from the encapsulation layer 350, thereby facilitating subsequent process of bonding the encapsulation layer 350 on another carrier substrate.

It should be noted that, with the support of the encapsulation layer 350, circuit boards may be eliminated. The effect of reducing the total thickness of the lens module may have already been achieved. Thus, it is unnecessary to reduce the thickness of the photosensitive chip 200 or the peripheral chips 230, thereby improving the mechanical strength and the reliability of the photosensitive chip 200 and the peripheral chips 230. In other embodiments, according to process requirements, the thickness of the photosensitive chip 200 and the peripheral chips 230 may be appropriately reduced. However, the amount of thickness reduction may not be substantial, thereby not compromising the mechanical strength and the reliability.

It should be further noted that, in one embodiment, the encapsulation layer 350 may be formed after the photosensitive chip 200 is bonded to the second carrier substrate 320. Compared to the solution of forming an opening in the encapsulation layer 350 and placing the photosensitive chip 200 into the opening, the present disclosure may avoid the issue of alignment error, thereby reducing complexity of the packaging process.

Continuing to refer to FIG. 5, in one embodiment, before the encapsulation layer 350 (as shown in FIG. 6) is formed, the packaging process may further include: forming a stress buffering layer 420 covering the sidewall of the optical filter 400.

The stress buffering layer 420 may help reduce the stress caused by the encapsulation layer 350 on the optical filter 400 and may reduce the probability of breaking the optical filter 400. Thus, the reliability and production yield of the packaging process may be improved, and the reliability of the lens module may be increased accordingly. In particular, the optical filter 400 may be the infrared filtering glass plate or the fully transparent glass plate. It is likely that the glass plate may break due to the stress. The stress buffering layer 420 may substantially reduce the probability of breaking the optical filter 400.

The stress buffering layer 420 may have a viscosity to ensure its adhesion on the optical filter 400. In one embodiment, the stress buffering layer 420 may be made of an epoxy-based glue. The epoxy-based glue may be an epoxy resin adhesive. The epoxy-based glue may be in various forms. By adjusting the composition, materials with different elastic modulus may be obtained. Thus, the stress that the optical filter 400 is subject to may be controlled according to actual requirements.

In one embodiment, after the photosensitive unit 250 (as shown in FIG. 1) is temporarily bonded on the second carrier substrate 320, the stress buffering layer 420 may be formed. Thus, the second carrier substrate 320 may provide a platform for the process of forming the stress buffering layer 420.

For example, the stress buffering layer 420 may be formed by using a dispensing process. By selecting the dispensing process, it is likely to improve the compatibility between the step of forming the stress buffering layer 420 and the current packaging process, thereby simplifying the process.

In one embodiment, the stress buffering layer 420 may also cover a sidewall of the bonding structure 410 to reduce the stress caused by the encapsulation layer 350 on the bonding structure 410, thereby further improving the reliability and production yield of the packaging process.

In other embodiments, a stress buffering layer may be formed before an optical filter is mounted on a photosensitive chip. Alternatively, the stress buffering layer may be formed after the optical filter is mounted on the photosensitive chip and before photosensitive unit is temporarily bonded on the second carrier substrate.

Figure 7:
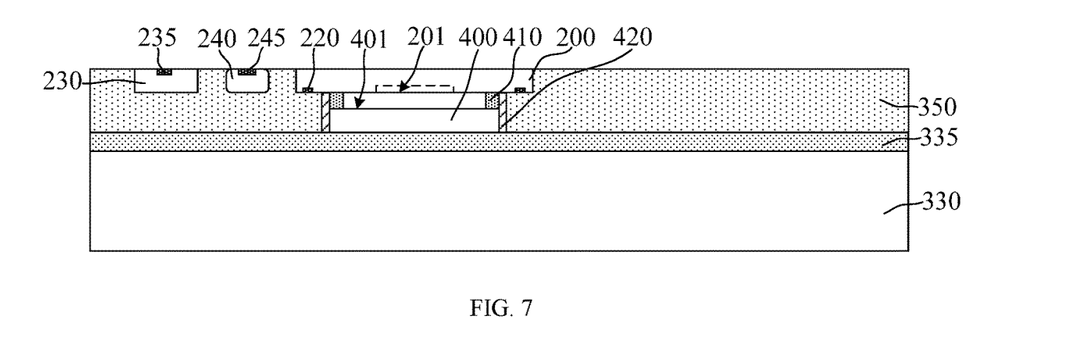

Referring to FIG. 7, after the encapsulation layer 350 is formed, a second debonding process may be performed to remove the second carrier substrate 320 (as shown in FIG. 6 and in S50 of FIG. 15).

The removal of the second carrier substrate 320 may expose the soldering pads of the functional components, thereby preparing for subsequent process of forming the redistribution layer structure 360. In one embodiment, the step of the second debonding process may include: sequentially removing the second carrier substrate 320 and the second temporary bonding layer 325 (as shown in FIG. 6). The description of the second debonding process may refer to the relevant description of the first debonding process and will not be repeated herein.

It should be noted that, after the encapsulation layer 350 is formed and before the second debonding process is performed, the packaging process may further include: temporarily bonding a surface of the encapsulation layer 350 facing away from the second carrier substrate 320 on a third carrier substrate 330.

The third carrier substrate 330 may be configured to provide a platform for subsequent process of forming the redistribution layer structure 360. In one embodiment, the third carrier substrate 330 may be a carrier wafer. In other embodiments, the third carrier substrate 330 may be other types of substrate.

For example, the encapsulation layer 350 may be temporarily bonded on the third carrier substrate 330 by a third temporary bonding layer 335. The detailed description of the third temporary bonding layer 335 may refer to the relevant description of the first temporary bonding layer 345 (as shown in FIG. 1) and will not be repeated herein.

Figure 8:
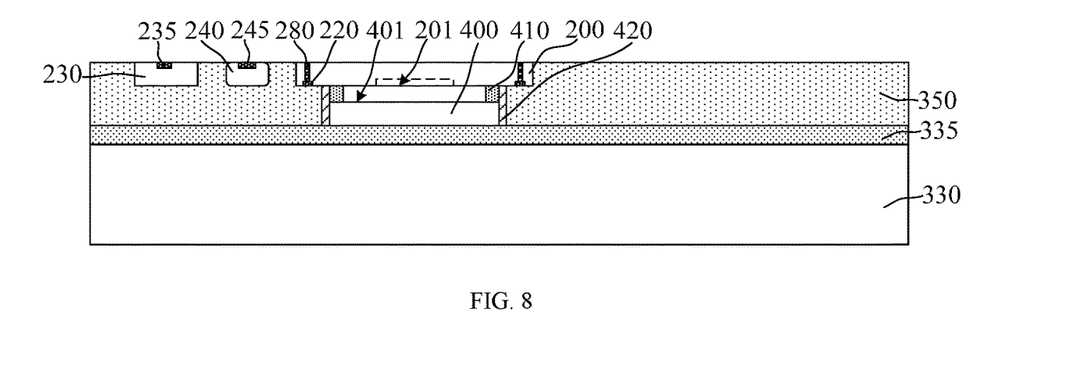
Figure 9:
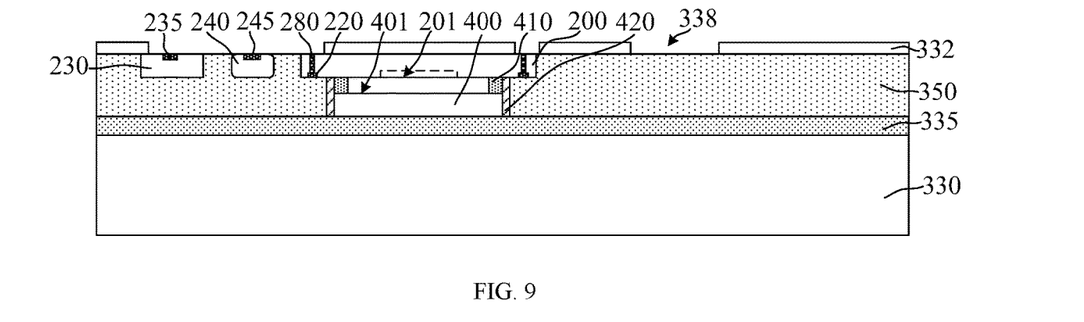
Figure 10:
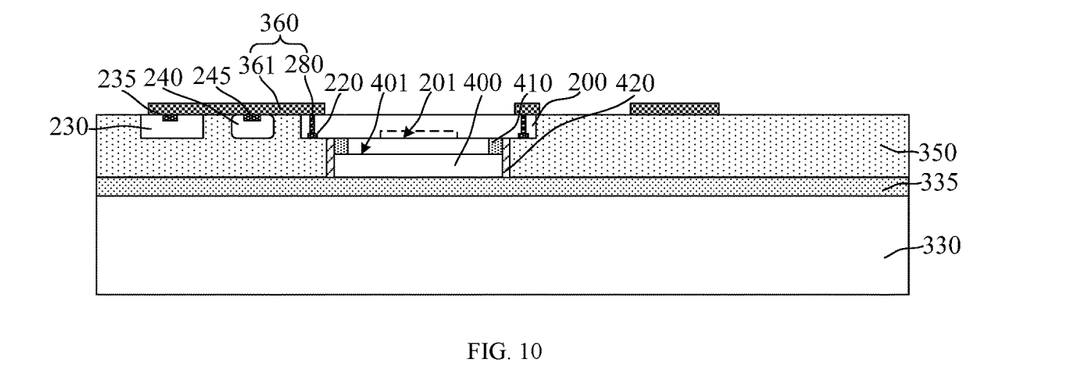

Referring to FIGS. 8-10, after the second carrier substrate 320 is removed, the redistribution layer structure 360 (as shown in FIG. 10) may be formed on a side of the encapsulation layer 350 facing away from the optical filter 400 to electrically connect the soldering pads of the photosensitive chip 200 and the soldering pads of the functional components (e.g., as shown in S60 of FIG. 15).

The redistribution layer structure 360 may be configured to achieve the electrical connection integration of forming the camera assembly.

In one embodiment, the encapsulation layer 350 and the redistribution layer structure 360 may be configured to reduce the physical distances between the photosensitive chip 200 and the functional components as well as the electrical connection distances between the photosensitive chip 200 and the functional components. Thus, the signal transmission speed may be increased, and the operational performance of the lens module may be improved. For example, the peripheral chips 230 may include one or two of the digital signal processing chip and the memory chip. Correspondingly, the shooting speed and the storing speed may be increased.

Further, by selecting the redistribution layer structure 360, it is likely to reduce the distances between the photosensitive chip 200 and the functional components while improving the feasibility of the electrical connection process. Compared to a wire bonding process, the redistribution layer structure 360 may facilitate batch processing and improve the packaging efficiency. In addition, because the redistribution layer structure 360 is formed on the side of the encapsulation layer 350 facing away from the optical filter 400, the process of forming the redistribution layer structure 360 may have little impact on the optical filter 400.

In one embodiment, the redistribution layer structure 360 may electrically connect the first chip soldering pads 220, the second chip soldering pads 235, and the electrodes 245.

For example, the step of forming the redistribution layer structure 360 may include: referring to FIG. 8, forming conductive posts 280 in the photosensitive chip 200, where the conductive posts 280 electrically connect to the corresponding soldering pads of the photosensitive chip 200.

The conductive posts 280 may electrically connect to the corresponding first chip soldering pads 220 of the photosensitive chip 200. The conductive posts 280 may be configured to be external electrodes of the photosensitive chip 200 to subsequently facilitate the electrical connections between the photosensitive chip 200 and the functional components through the conductive posts 280.

The conductive posts 280 may be electrically connected to metal interconnection structures in the photosensitive chip 200 or may pass through the photosensitive chip 200 to directly electrically connect to the corresponding first chip soldering pads 220.

The top surface of the conductive posts 280 may be exposed on the encapsulation layer 350. Through the conductive posts 280, the external electrodes of the photosensitive chip 200 and the soldering pads of the functional components may be disposed on a same side of the encapsulation layer 350, thereby facilitating subsequent process of forming the redistribution layer structure 360. The top surface of the conductive posts 280 may refer to: a surface of the conductive posts 280 facing away from the optical filter 400 along an extension direction of the conductive posts 280.

In one embodiment, the conductive posts 280 may be made of copper to improve conductive performance of the conductive posts 280 and to reduce complexity of the process of forming the conductive posts 280. In other embodiments, the conductive posts 280 may be made of other suitable conductive materials such as tungsten.

For example, the conductive posts 280 may be formed by a through-silicon via (TSV) process.

Referring to FIG. 9, after the conductive posts 280 are formed, a dielectric layer 332 may be formed on a side of the encapsulation layer 350 facing away from the optical filter 400. The dielectric layer 332 may cover the encapsulation layer 350, the photosensitive chip 200, the functional components (not labelled), and the conductive posts 280. Interconnection trenches 338 may be formed in the dielectric layer 332 by a graphic patterning process. The interconnection trenches 338 may expose the soldering pads of the functional components and the conductive posts 280.

The interconnection trenches 338 in the dielectric layer 332 may be configured to define shapes, positions and dimensions of subsequent interconnections. In one embodiment, the dielectric layer 332 may be made of photosensitive material. Accordingly, the interconnection trenches 338 may be formed by a photolithography process, thereby simplifying complexity of the process of forming the interconnection trenches 338.

For example, the dielectric layer 332 may be made of photosensitive polyimide, photosensitive benzocyclobutene, or photosensitive polybenzoxazole.

Referring to FIG. 10, interconnect lines 361 may be formed in the interconnection trenches 338 (as shown in FIG. 9). The dielectric layer 332 (as shown in FIG. 9) may be removed.

The interconnect lines 361 and the conductive posts 280 together may form the redistribution layer structure 360.

In one embodiment, the interconnect lines 361 may be formed in the interconnection trenches 338 by an electroplating process.

In one embodiment, the interconnect lines 361 may be made of copper. Copper has substantially low resistivity, which is beneficial to improve electrical connection reliability and electrical conductivity of the interconnect lines 361. Further, copper has superior filling property, which is beneficial to simplify complexity of the process of forming the interconnect lines 361 and to improve the formation quality. In other embodiments, the interconnect lines 361 may be made of other suitable conductive materials such as tungsten.

After the interconnect lines 361 are formed, the dielectric layer 332 may be removed, thereby preparing for subsequent process. In one embodiment, the dielectric layer 332 may be made of corrosion resistant material. Thus, after the interconnect lines 361 are formed, the dielectric layer 332 may be removed by a reactive ion etching process.

In one embodiment, the encapsulation layer 350 may be configured to provide a platform for the process of forming the redistribution layer structure 360. Accordingly, complexity of the process of forming the redistribution layer structure 360 may be reduced.

In other embodiments, the interconnect lines 361 may be formed by a direct etching process. For example, the step of forming the redistribution layer structure may include: forming the conductive posts in the photosensitive chip to electrically connect to the corresponding soldering pads of the photosensitive chip; forming a conductive layer on a surface of the encapsulation layer facing away from the optical filter to cover the encapsulation layer, the photosensitive chip, the functional components, and the conductive posts; performing an etching process on the conductive layer to form the interconnect lines, where the interconnect lines cover the conductive posts and the soldering pads of the functional components, and the interconnect lines and the conductive posts form the redistribution layer structure.

In one embodiment, the interconnect lines may be made of conductive materials such as aluminum, which is easily patterned by an etching process.

Figure 11:
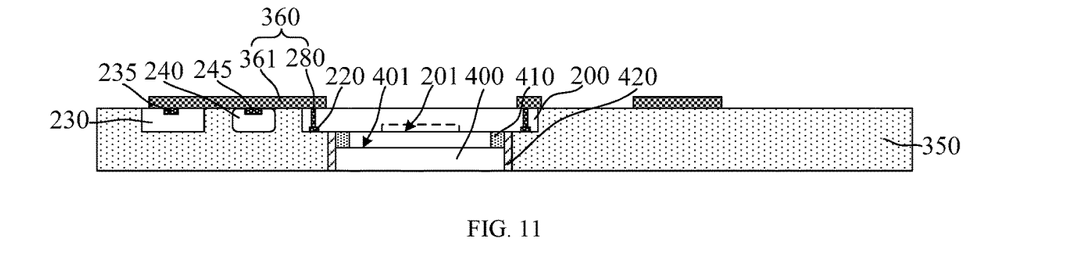

Referring to FIG. 11, after the redistribution layer structure 360 is formed, a third debonding process may be performed to remove the third carrier substrate 330 (as shown in FIG. 10).

The removal of the third carrier substrate 330 may provide a process foundation for subsequently assembling the lens assembly.

In one embodiment, the step of the third debonding process may include: sequentially removing the third carrier substrate 330 and the third temporary bonding layer 335 (as shown in FIG. 10). The detailed description of the third debonding process may refer to the relevant description of the first debonding process and will not be repeated herein.

Figure 12:
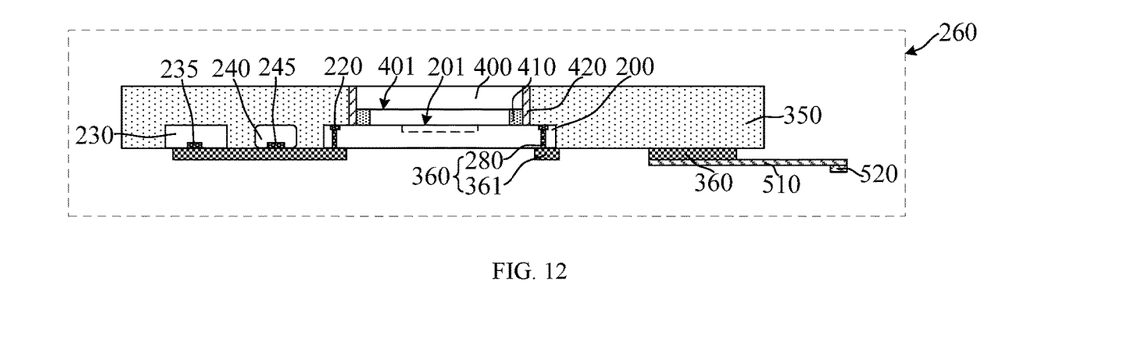

Referring to FIG. 12, after the third carrier substrate 330 (as shown in FIG. 10) is removed, the packaging process may further include: performing a dicing process on the encapsulation layer 350.

Through the dicing process, individual camera assembly 260 satisfying the dimension requirement may be formed, thereby preparing for subsequent process of assembling the lens assembly. In one embodiment, the dicing process may be a laser cutting process.

It should be noted that, in one embodiment, the third debonding process may be performed before the dicing process is performed. In other embodiments, the third debonding process may be performed after the dicing process is performed. Correspondingly, the third carrier substrate 330 may provide a platform for the dicing process.

Continuing to refer to FIG. 12, after the redistribution layer structure 360 is formed, the packaging process may further include: bonding a flexible printed circuit (FPC) board 510 on the redistribution layer structure 360.

Under the circumstance that circuit boards are eliminated, the FPC board 510 may provide electrical connections between the camera assembly 260 and the subsequent lens assembly and between the formed lens module and other components. After the lens module is subsequently formed, the lens module may also be electrically connected to other components in an electronic device through the FPC board 510, thereby realizing a normal shooting function of the electronic device.

In one embodiment, the FPC board 510 may include electronic circuits. The FPC board 510 may be bonded on the redistribution layer structure 360 by a metal bonding process, thereby achieving the electrical connections. For example, the FPC board 510 may be bonded on the interconnect lines 361.

In one embodiment, to improve the process feasibility, after the third debonding process and the dicing process are performed, the FPC board 510 may be bonded on the redistribution layer structure 360.

It should be noted that a connector 520 may be mounted on the FPC board 510 to electrically connect the FPC board 510 to other circuit components. When the lens module is used in an electronic device, the connector 520 may be electrically connected to a main board of the electronic device, thereby facilitating information transmission between the lens module and other components in the electronic device. For example, image information may be transferred from the lens module to the electronic device. For example, the connector 520 may be a gold finger connector.

Correspondingly, the present disclosure also provides a camera assembly. Continuing to refer to FIG. 12, a structural diagram of an exemplary camera assembly according to the embodiments of the present disclosure is shown.

The camera assembly 260 may include: the encapsulation layer 350, the photosensitive unit 250 (as shown in FIG. 1) and the functional components (not labelled) that are embedded in the encapsulation layer 350. The photosensitive unit 250 may include the photosensitive chip 200 and the optical filter 400 mounted on the photosensitive chip 200. The bottom surface of the encapsulation layer 350 may expose the photosensitive chip 200 and the functional components.

The top surface of the encapsulation layer 350 may be higher than the photosensitive chip 200 and the functional components and may expose the optical filter 400. Both the photosensitive chip 200 and the functional components may have soldering pads (not labelled). The soldering pads of the photosensitive chip 200 may face away from the bottom surface of the encapsulation layer 350. The soldering pads of the functional components may expose from the bottom surface of the encapsulation layer 350. The redistribution layer structure 360 may be disposed on the bottom surface of the encapsulation layer 350. The redistribution layer structure 360 may be electrically connected to the soldering pads.

The encapsulation layer 350 may play a role in holding the photosensitive chip 200 and the functional components in place, thereby achieving the packaging integration of the photosensitive chip 200 and the functional components. The encapsulation layer 350 may not only reduce the space occupied by the frame of the lens assembly, but also eliminate the circuit boards. Thus, the total thickness of the subsequently formed lens module may be substantially reduced to satisfy the requirements for miniaturization and ultra-thin thickness of the lens module.

The encapsulation layer 350 may be made of plastic encapsulation material. The encapsulation layer 350 may also play a role in insulation, sealing and moisture-proof, and may improve the reliability of the lens module. In one embodiment, the encapsulation layer 350 may be made of epoxy resin.

In one embodiment, the encapsulation layer 350 may include a top surface and a bottom surface facing opposite to each other. The top surface of the encapsulation layer 350 may be configured to mount the lens assembly.

In one embodiment, in the process of packaging the camera assembly 260, after the photosensitive chip 200 and the functional components are temporarily bonded on the carrier substrate, the encapsulation layer 350 may be formed on the carrier substrate. Thus, the bottom surface of the encapsulation layer 350 may expose the photosensitive chip 200 and the functional components.

In one embodiment, the top surface of the encapsulation layer 350 may be higher than the photosensitive chip 200 and the functional components. The encapsulation layer 350 may also cover the sidewall of the optical filter 400 to improve the sealing performance of the cavity in the photosensitive unit 250 and to prevent water vapor and oxidizing gas from entering the cavity, thereby ensuring the performance of the photosensitive chip 200.

In one embodiment, the photosensitive chip 200 may be a CMOS image sensor chip. In other embodiments, the photosensitive chip 200 may be a CCD image sensor chip. The photosensitive chip 200 may include the photosensitive region 200a (as shown in FIG. 2) and the peripheral region 200b (as shown in FIG. 2) surrounding the photosensitive region 200a. The photosensitive chip 200 may also have the optical signal receiving surfaces 201 located in the photosensitive region 200a.

The photosensitive chip 200 may be a silicon-based chip. The soldering pads of the photosensitive chip 200 may be configured to electrically connect the photosensitive chip 200 to other chips or components. In one embodiment, the photosensitive chip 200 may have the first chip soldering pads 220 located in the peripheral region 200b. The first chip soldering pads 220 may face toward the optical filter 400. That is, the first chip soldering pads 220 may face away from the bottom surface of the encapsulation layer 350.

The optical filter 400 may be mounted on the photosensitive chip 200 to prevent the packaging process from polluting the optical signal receiving surfaces 201 and to reduce the total thickness of the lens module.

To support the normal operation of the lens module, the optical filter 400 may be an infrared filtering glass plate or a fully transparent glass plate. In one embodiment, the optical filter 400 may be the infrared filtering glass plate to eliminate an effect of infrared light in the incident light on performance of the photosensitive chip 200, thereby improving imaging effectiveness.

In one embodiment, the optical filter 400 may be mounted on the photosensitive chip 200 through the bonding structure 410. The bonding structure 410 may surround the optical signal receiving surfaces 201 of the photosensitive chip 200. The bonding structure 410 may be configured to physically connect the optical filter 400 and the photosensitive chip 200 and to form a cavity (not labelled) enclosed by the optical filter 400, the bonding structure 410, and the photosensitive chip 200 to prevent the optical filter 400 from directly contacting the photosensitive chip 200, thereby avoiding the performance degradation of the photosensitive chip 200 caused by the optical filter 400.

In one embodiment, the bonding structure 410 may be made of a photolithographic dry film. In other embodiments, the bonding structure 410 may be made of a photolithographic polyimide, a photolithographic polybenzoxazole (PBO), or a photolithographic benzocyclobutene (BCB).

In one embodiment, the bonding structure 410 may surround the optical signal receiving surfaces 201 to place the optical filter 400 disposed above the optical signal receiving surfaces 201 in a photo-sensing path of the photosensitive chip 200, thereby ensuring the optical performance of the photosensitive chip 200.

In one embodiment, only one photosensitive unit 250 may be illustrated. In other embodiments, when the formed lens module is applied to a dual camera or array module product, a plurality of photosensitive units 250 may be included.

It should be noted that because the encapsulation layer 350 covers the sidewall of the optical filter 400, the camera assembly 260 may also include: the stress buffering layer 420 disposed between the encapsulation layer 350 and the sidewall of the optical filter 400.

The stress buffering layer 420 may help reduce the stress caused by the encapsulation layer 350 on the optical filter 400 to reduce the probability of breaking the optical filter 400. Thus, the reliability of the lens module may be improved. In one embodiment, the stress buffering layer 420 may be made of epoxy-based glue.

In one embodiment, the stress buffering layer 420 may be disposed between the encapsulation layer 350 and the sidewall of the bonding structure 410, thereby reducing the stress caused by the encapsulation layer 350 on the bonding structure 410 and improving the reliability and production yield of the camera assembly 260.

The functional components may be components with specific functions in the camera assembly other than the photosensitive chip 200. The functional components may include at least one of peripheral chips 230 or passive components 240. In one embodiment, the soldering pads of the functional components may be exposed from the bottom surface of the encapsulation layer 350, thereby reducing complexity of the process of forming the redistribution layer structure 360.

In one embodiment, the functional components may include the peripheral chips 230 and the passive components 240. The peripheral chips 230 may be active components and may be configured to provide peripheral circuits for the photosensitive chip 200. For example, the peripheral chips 230 may include an analog power supply circuit, a digital power supply circuit, a voltage buffer circuit, a shutter control circuit, and a shutter driving circuit, etc.

In one embodiment, the peripheral chips 230 may include one or two of digital signal processing chip and memory chip. In other embodiments, the peripheral chips 230 may also include chips of other functional types. For illustrative purposes, FIG. 12 only shows one peripheral chip 230. But the number of the peripheral chips 230 may be more than one.

The peripheral chips 230 may be silicon-based chips. The peripheral chips 230 may have soldering pads for electrically connecting to other chips and components. In one embodiment, the peripheral chips 230 may have the second chip soldering pads 235. The second chip soldering pads 235 may be exposed from the bottom surface of the encapsulation layer 350.

The passive components 240 may be configured to provide specific functions in the photo-sensing operation of the photosensitive chip 200. The passive components 240 may include resistors, capacitors, inductors, diodes, transistors, potentiometers, relays, drivers, and other small size electronic components. For illustrative purposes, FIG. 12 only shows one passive component 240. But the number of the passive components 240 may be more than one.

The passive components 240 may also have soldering pads for electrically connecting to other chips and components. In one embodiment, the soldering pads of the passive components 240 may be electrodes 245. The electrodes 245 may be exposed from the bottom surface of the encapsulation layer 350.

The redistribution layer structure 360 may be configured to electrically integrate the camera assembly 260. The operational performance (e.g., improving shooting speed and storing speed) of the lens module may be improved by the redistribution layer structure 360 and the encapsulation layer 350. Moreover, the feasibility of the electrical connection process and the packaging efficiency may be improved by the redistribution layer structure 360.

In one embodiment, the redistribution layer structure 360 may electrically connect the first chip soldering pads 220, the second chip soldering pads 235, and the electrodes 245.

Because the soldering pads of the functional components are exposed from the bottom surface of the encapsulation layer 350 and the soldering pads of the photosensitive chip 200 face away from the bottom surface of the encapsulation layer 350, the redistribution layer structure 360 may include: the conductive posts 280 disposed in the photosensitive chip 200 and electrically connected to the soldering pads of the photosensitive chip 200, and the interconnect lines 361 disposed on the soldering pads of the functional components and the conductive posts 280 and electrically connected to the soldering pads of the functional components and the conductive posts 280.

The conductive posts 280 may electrically connect to the corresponding first chip soldering pads 220 of the photosensitive chip 200. The conductive posts 280 may be configured to be external electrodes of the photosensitive chip 200.

The conductive posts 280 may be exposed from the bottom surface of the encapsulation layer 350. As such, the external electrodes of the photosensitive chip 200, the second chip soldering pads 235, and the electrodes 245 may be disposed on a same side of the encapsulation layer 350, thereby facilitating the electrical connections between the photosensitive chip 200, the peripheral chips 230, and the passive components 240. The conductive posts 280 may be electrically connected to metal interconnection structures in the photosensitive chip 200 or may pass through the photosensitive chip 200 to directly electrically connect to the corresponding first chip soldering pads 220.

In one embodiment, the conductive posts 280 may be made of copper to improve the conductive performance of the conductive posts 280 and to reduce complexity of the process of forming the conductive posts 280. In other embodiments, the conductive posts 280 may be made of other suitable conductive materials such as aluminum.

In one embodiment, because the conductive posts 280 and the soldering pads of the functional components are exposed from the bottom surface of the encapsulation layer 350, complexity of the process of forming the interconnect lines 361 may be reduced accordingly.

In one embodiment, the interconnect lines 361 may be made of copper. Copper has substantially low resistivity, which is beneficial to improve electrical connection reliability and electrical conductivity of the redistribution layer structure 360. In other embodiments, the interconnect lines 361 may be made of other suitable conductive materials such as tungsten.

In one embodiment, the camera assembly 260 may further include: the FPC board 510 disposed on the redistribution layer structure 360. Under the circumstance that circuit boards are eliminated, the FPC board 510 may provide electrical connections between the camera assembly 260 and the lens assembly and between the lens module and other components. The lens module may also be electrically connected to other components in the electronic device through the FPC board 510, thereby realizing a normal shooting function of the electronic device. For example, the FPC board 510 may be bonded on the interconnect lines 361. The FPC board 510 may include electronic circuits, thereby achieving the electrical connections between the FPC board 510 and the redistribution layer structure 360.

It should be noted that the connector 520 may be mounted on the FPC board 510. When the lens module is used in the electronic device, the connector 520 may be electrically connected to the main board of the electronic device, thereby facilitating information transmission between the lens module and other components in the electronic device. For example, image information may be transferred from the lens module to the electronic device. For example, the connector 520 may be a gold finger connector.

In the present disclosure, the camera assembly may be formed by using the packaging method described in the foregoing embodiments or may be formed by using other packaging methods. The detailed description of the camera assembly may refer to the relevant description in the foregoing embodiments and will not be repeated herein.

Figure 13:
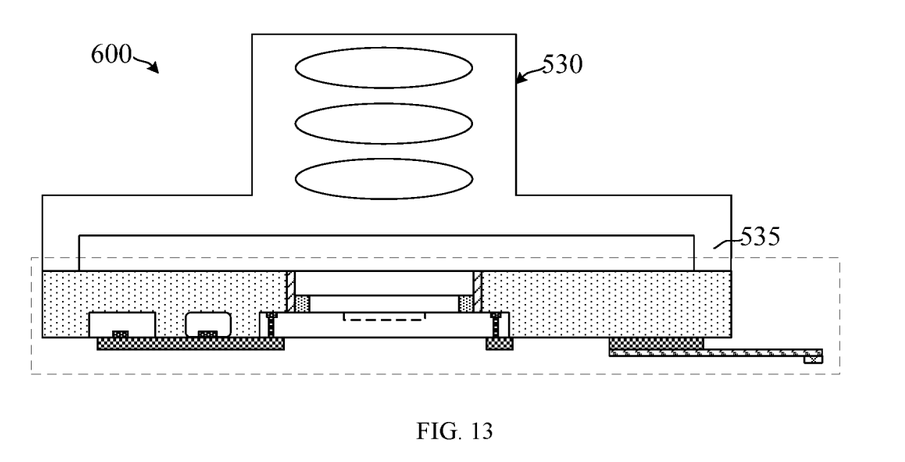
FIG. 13 illustrates a schematic view of an exemplary lens module according to an embodiment of the present disclosure.

Correspondingly, the present disclosure also provides a lens module. FIG. 13 illustrates a schematic view of an exemplary lens module according to an embodiment of the present disclosure.

The lens module 600 may include: the camera assembly (as shown in the dashed box in FIG. 13) according to embodiments of the present disclosure and a lens assembly 530 including a frame 535. The frame 535 may be mounted on the top surface of the encapsulation layer (not labelled) and may surround the photosensitive unit (not labelled) and the functional components (not labelled). The lens assembly 530 may be electrically connected to the photosensitive chip (not labelled) and the functional components.

The lens assembly 530 may include the frame 535, a motor (not shown) mounted on the frame 535, and a lens group (not labelled) mounted on the motor. The frame 535 may facilitate assembling the lens assembly 530 and may place the lens group in the photo-sensing path of the photosensitive unit.

In one embodiment, the camera assembly may have a thin thickness. The thickness of the lens assembly 530 may be reduced by the encapsulation layer, thereby reducing the total thickness of the lens module 600. Moreover, the photosensitive unit and the functional components may be disposed inside the frame 535. Compared to the solution of mounting the functional components (e.g., peripheral chips) on the peripheral main board, the present disclosure may reduce distances between the photosensitive unit and the functional components, correspondingly reduce the dimension of the lens module 600, shorten electrical connection distances, substantially increase signal transmission speed of the lens module 600, and improve the operational performance (e.g., improving the shooting speed and the storing speed) of the lens module 600. Further, the method of integrating the photosensitive unit and the functional components in the encapsulation layer and disposing the photosensitive unit and the functional components inside the frame 535 may protect the photosensitive unit and the functional components. Thus, the reliability and stability of the lens module 600 may be improved, and the imaging quality of the lens module 600 may be ensured.

In one embodiment, an FPC board (not labelled) may be bonded on a redistribution layer structure (not labelled). The motor in the lens assembly 530 may be electrically connected to various chips and components in the camera assembly through the FPC board.

It should be noted that the detailed description of the camera assembly may refer to the relevant description in the foregoing embodiments and will not be repeated herein.

Figure 14:
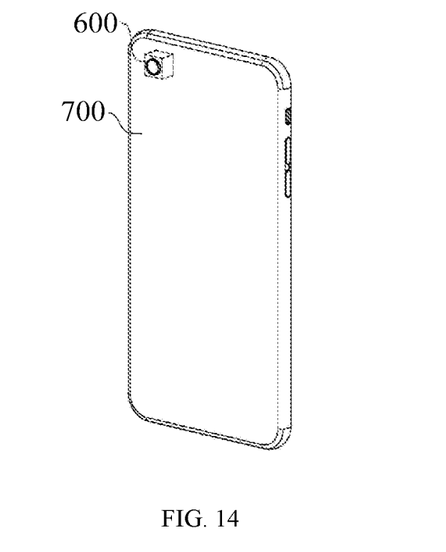
FIG. 14 illustrates a schematic view of an exemplary electronic device according to an embodiment of the present disclosure.

Correspondingly, the present disclosure also provides an electronic device. FIG. 14 illustrates a schematic view of an exemplary electronic device according to an embodiment of the present disclosure.

In one embodiment, the electronic device 700 may include the lens module 600 according to embodiments of the present disclosure.

The high reliability and superior operational performance of the lens module 600 may correspondingly improve the shooting quality, the shooting speed, and the storing speed of the electronic device 700. Moreover, the ultra-thin total thickness of the lens module 600 may improve user experience.

For example, the electronic device may be a mobile phone, a tablet computer, a camera, a camcorder, or other devices having a camera function.

As disclosed, the technical solutions of the present disclosure have the following advantages.

In the embodiments of the present disclosure, the photosensitive chip and the functional components may be integrated in the encapsulation layer and may be electrically connected through the redistribution layer structure. Compared to surface-mounting the functional components on the peripheral main board, the embodiments of the present disclosure may effectively reduce physical distances between the photosensitive chip and the functional components, correspondingly shorten electrical connection distances between the photosensitive chip and the functional components, and consequently improve the signal transmission speed. Thus, the operational performance (e.g., improving the image shooting speed and image storing speed) of the lens module may be improved. Further, the encapsulation layer and the redistribution layer structure may be configured to eliminate circuit boards (e.g., PCBs) and to reduce the total thickness of the lens module, thereby satisfying the requirements for miniaturization and ultra-thin thickness of the lens module.

The details of the present disclosure have been described through the embodiments provided above. However, it should be understood that the above embodiments are only for the purpose of illustration and description. Further, those skilled in the art can understand that the present disclosure is not limited to the above embodiments, and various modifications and changes can be made according to the principles of the present disclosure. These modifications and modifications are all in the scope of the present disclosure. The scope of the present disclosure is defined by the appended claims and their equivalents.

What is claimed is:

1. A method for packaging a camera assembly, comprising:
providing a photosensitive chip;
mounting an optical filter on the photosensitive chip;
temporarily bonding the photosensitive chip and functional components on a carrier substrate, wherein the photosensitive chip has soldering pads facing away from the carrier substrate and the functional components have soldering pads facing toward the carrier substrate;
forming an encapsulation layer covering the carrier substrate, the photosensitive chip, and the functional components, and exposing the optical filter;
after the encapsulation layer is formed, removing the carrier substrate; and
after the carrier substrate is removed, forming a redistribution layer structure on a side of the encapsulation layer facing away from the optical filter to electrically connect the soldering pads of the photosensitive chip with the soldering pads of the functional components,
wherein after bonding the photosensitive chip and the functional components on the carrier substrate, forming a stress buffering layer on sidewall of the optical filter between the sidewall of the optical filter and the soldering pads of the photosensitive chip, wherein:
the stress buffering layer is formed on the sidewall of the optical filter before the optical filter is mounted on the photosensitive chip; or
the stress buffering layer is formed on the sidewall of the optical filter after the photosensitive chip is temporarily bonded on the carrier substrate and before the encapsulation layer is formed.

2. The method according to claim 1, wherein forming the redistribution layer structure includes:
forming conductive posts in the photosensitive chip to electrically connect to the soldering pads of the photosensitive chip;
forming a dielectric layer on a surface of the encapsulation layer facing away from the optical filter to cover the encapsulation layer, the photosensitive chip, the functional components, and the conductive posts;
forming interconnection trenches in the dielectric layer by a patterning process to expose the soldering pads of the functional components and the conductive posts;
forming interconnect lines in the interconnection trenches, wherein the interconnect lines and the conductive posts together form the redistribution layer structure; and
removing the dielectric layer.

3. The method according to claim 2, further including:
forming the interconnect lines in the interconnection trenches by using an electroplating process.

4. The method according to claim 2, further including:
forming the conductive posts in the photosensitive chip by using a through-silicon via (TSV) process.

5. The method according to claim 2, further including:
removing the dielectric layer by using a reactive ion etching process.

6. The method according to claim 1, wherein forming the redistribution layer structure includes:
forming conductive posts in the photosensitive chip to electrically connect to the soldering pads of the photosensitive chip;
forming a conductive layer on a surface of the encapsulation layer facing away from the optical filter to cover the encapsulation layer, the photosensitive chip, the functional components, and the conductive posts; and
etching the conductive layer to form interconnect lines to cover the conductive posts and the soldering pads of the functional components, wherein the interconnect lines and the conductive posts together form the redistribution layer structure.

7. The method according to claim 1, wherein forming the encapsulation layer includes:
after the optical filter is mounted on the photosensitive chip, and the photosensitive chip and the functional components are temporarily bonded on the carrier substrate, placing the carrier substrate in a mold having an upper part and a lower part;
positioning the carrier substrate between the upper part and the lower part of the mold;
after the mold is closed, pressing the mold against the carrier substrate and the optical filter and forming a cavity between the upper part and the lower part of the mold;
injecting a molding material into the cavity to form the encapsulation layer; and
removing the mold.

8. The method according to claim 1, wherein:
the encapsulation layer covers the sidewall of the optical filter,
the method further includes forming a bonding structure connecting the photosensitive chip and the optical filter, wherein the stress buffering layer is further formed adhered to a sidewall of the bonding structure.

9. The method according to claim 1, wherein:
the stress buffering layer is formed by using a dispensing process.

10. The method according to claim 1, wherein:
after the photosensitive chip is temporarily bonded on the carrier substrate, the optical filter is mounted on the photosensitive chip.

11. The method according to claim 1, wherein:
after the redistribution layer structure is formed, the method further includes bonding a flexible printed circuit (FPC) board on the redistribution layer structure.

* * * * *